(12) United States Patent
John Wilson et al.

(10) Patent No.: US 11,388,731 B2
(45) Date of Patent: *Jul. 12, 2022

(54) CONTROL CHANNEL CODE RATE SELECTION

(71) Applicant: QUALCOMM Incorporated, San Diego, CA (US)

(72) Inventors: Makesh Pravin John Wilson, San Diego, CA (US); Tao Luo, San Diego, CA (US); Sony Akkarakaran, Poway, CA (US); Wooseok Nam, San Diego, CA (US); Sumeeth Nagaraja, Los Altos, CA (US); Yang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/069,671

(22) Filed: Oct. 13, 2020

(65) Prior Publication Data
US 2021/0029718 A1    Jan. 28, 2021

Related U.S. Application Data

(63) Continuation of application No. 15/710,248, filed on Sep. 20, 2017, now Pat. No. 10,805,939.
(Continued)

(51) Int. Cl.
*H04W 72/08* (2009.01)
*H04L 5/00* (2006.01)
(Continued)

(52) U.S. Cl.
CPC ......... *H04W 72/085* (2013.01); *H04L 1/0041* (2013.01); *H04L 1/0067* (2013.01);
(Continued)

(58) Field of Classification Search
CPC .......... H04W 72/085; H04W 72/0446; H04W 72/0413; H04W 72/042; H04L 1/0041;
(Continued)

(56) References Cited

U.S. PATENT DOCUMENTS

| | | |
|---|---|---|
| 2011/0269490 A1 | 11/2011 | Earnshaw et al. |
| 2011/0317615 A1 | 12/2011 | Soong et al. |

(Continued)

FOREIGN PATENT DOCUMENTS

| | | |
|---|---|---|
| CN | 103023618 A | 4/2013 |
| CN | 103916220 A | 7/2014 |

(Continued)

OTHER PUBLICATIONS

Division Property of Inequality, published in the Internet, http://www.solving-math-problems.com/math-properties-inequality-multiplication.html, 2016, 7 pages.

(Continued)

*Primary Examiner* — Ricardo H Castaneyra
(74) *Attorney, Agent, or Firm* — Qualcomm Incorporated

(57) ABSTRACT

Certain aspects of the present disclosure generally relate to wireless communications and, more particularly, to methods and apparatus for code rate selection for control channels. An exemplary method generally includes selecting, from a set of code rates, a code rate to be used to encode a stream of bits using a polar code, based on at least one of a downlink control channel aggregation size, an uplink control channel assignment, or a payload size of the stream of bits, encoding the stream of bits using the polar code and the selected code rate, and transmitting the encoded stream of bits.

21 Claims, 10 Drawing Sheets

Related U.S. Application Data

(60) Provisional application No. 62/445,214, filed on Jan. 11, 2017.

(51) Int. Cl.
*H04L 1/00* (2006.01)
*H04W 72/04* (2009.01)

(52) U.S. Cl.
CPC .......... *H04L 1/0072* (2013.01); *H04L 5/0046* (2013.01); *H04L 5/0016* (2013.01); *H04L 5/0053* (2013.01); *H04W 72/042* (2013.01); *H04W 72/0413* (2013.01); *H04W 72/0446* (2013.01)

(58) Field of Classification Search
CPC ... H04L 1/0072; H04L 1/0067; H04L 5/0046; H04L 5/0053; H04L 5/0016; H04L 1/0065; H04L 1/0057; H03M 13/35; H03M 13/13; H03M 13/6356; H03M 13/6362
See application file for complete search history.

(56) References Cited

U.S. PATENT DOCUMENTS

| | | | |
|---|---|---|---|
| 2014/0126525 | A1 | 5/2014 | Shen et al. |
| 2014/0208183 | A1 | 7/2014 | Mahdavifar et al. |
| 2015/0092886 | A1 | 4/2015 | Ionita et al. |
| 2016/0182187 | A1 | 6/2016 | Kim et al. |
| 2016/0308644 | A1 | 10/2016 | Shen et al. |
| 2016/0352464 | A1 | 12/2016 | Shen et al. |
| 2017/0047947 | A1 | 2/2017 | Hong et al. |
| 2018/0034587 | A1* | 2/2018 | Kim .................. H03M 13/2792 |
| 2018/0199350 | A1 | 7/2018 | John Wilson et al. |

FOREIGN PATENT DOCUMENTS

| | | |
|---|---|---|
| CN | 102959890 B | 12/2015 |
| CN | 105450363 A | 3/2016 |
| CN | 106230555 A | 12/2016 |
| WO | 2014005322 A1 | 1/2014 |
| WO | WO-2016099157 A1 | 6/2016 |
| WO | WO-2016101089 A1 | 6/2016 |
| WO | 2017122045 A1 | 7/2017 |

OTHER PUBLICATIONS

Hashemi S.A., et al., "Partitioned Successive—Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].

International Search Report and Written Opinion—PCT/US2017/066129—ISA/EPO—dated May 17, 2018.

International Preliminary Report on Patentability—PCT/US2017/066129, The International Bureau of WIPO—Geneva, Switzerland, dated Jul. 25, 2019.

Zhou H., et al., "Segmented CRC-Aided SC List Polar Decoding", 2016 IEEE 83rd Vehicular Technology Conference, May 15, 2016 (May 15, 2016), XP032918751, pp. 1-5, DOI: 10.1109/VTCSPRING.2016.7504469, [retrieved on Jul. 5, 2016], Abstract, Sections III.

NTT Docomo: "RAN WG's Progress on NR Technology SI in the October Meeting", R2-168015, 3GPP TSG-RAN WG2 #96, Nov. 14-18, 2016, Reno, USA, 30 Pages.

Qualcomm Incorporated: "A Comprehensive Rate-Matching Scheme for Polar Codes and Performance Evaluation", 3GPP Draft, 3GPP TSG-RAN WG1 #88b, R1-1705634, A Comprehensive Rate-Matching Scheme for Polar Codes and Performance Evaluation, 3rd Generation Partnership Project (3GPP), Mobile Competence Centre, 650, Route Des Lucioles, vol. RAN WG1, No. Spokane, USA, Apr. 3, 2017-Apr. 7, 2017, Apr. 2, 2017 (Apr. 2, 2017), XP051243756, 9 pages, Retrieved from the Internet: URL: http://www.3gpp.org/ftp/Meetings_3GPP_SYNC/RAN1/Docs/ [retrieved on Apr. 2, 2017], pp. 1,2,5, Sections 2-3, the Whole Document.

Qualcomm Incorporated: "A Comprehensive Rate-Matching Scheme for Polar Codes and Performance Evaluation", R1-1706675, 3GPP TSG-RAN WG1 #88b, Apr. 3-7, 2017 (Apr. 7, 2017), pp. 1-9. URL: http://www.3gpp.org/ftp/tsg_ran/WG1_RL1/TSGR1_88b/Docs/R1-1706675.zip.

Taiwan Search Report—TW106143891—TIPO—dated Mar. 16, 2021.

* cited by examiner

CONTROL CHANNEL CODE RATE SELECTION

CLAIM OF PRIORITY UNDER 35 U.S.C. § 119

This application is a continuation of U.S. patent application Ser. No. 15/710,248, filed Sep. 20, 2017, which claims benefit of U.S. Provisional Patent Application Ser. No. 62/445,214, filed Jan. 11, 2017, which are hereby assigned to the assignee hereof and hereby expressly incorporated by reference herein in their entirety as if fully set forth below and for all applicable purposes.

FIELD OF THE DISCLOSURE

Certain aspects of the present disclosure generally relate to wireless communications and, more particularly, to methods and apparatus for control channel code rate selection.

DESCRIPTION OF RELATED ART

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an e NodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a need for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications in a wireless network.

Certain aspects of the present disclosure provide a method for wireless communications in a network. The method generally includes selecting, from a set of code rates, a code rate to be used to encode a stream of bits using a polar code, based on at least one of a downlink control channel aggregation size, an uplink control channel assignment, or a payload size of the stream of bits, encoding the stream of bits using the polar code and the selected code rate, and transmitting the encoded stream of bits.

Certain aspects of the present disclosure provide an apparatus for wireless communications in a network. The apparatus generally includes at least one processor configured to: select, from a set of code rates, a code rate to be used to encode a stream of bits using a polar code, based on at least one of a downlink control channel aggregation size, an uplink control channel assignment, or a payload size of the stream of bits, encode the stream of bits using the polar code and the selected code rate, and transmit the encoded stream of bits. The apparatus also generally includes a memory coupled with the at least one processor.

Certain aspects of the present disclosure provide an apparatus for wireless communications in a network. The apparatus generally includes means for selecting, from a set of code rates, a code rate to be used to encode a stream of bits using a polar code, based on at least one of a downlink control channel aggregation size, an uplink control channel assignment, or a payload size of the stream of bits, means for encoding the stream of bits using the polar code and the selected code rate, and means for transmitting the encoded stream of bits.

Certain aspects of the present disclosure provide a non-transitory computer-readable medium for wireless communications in a network. The non-transitory computer-readable medium generally includes instructions that, when executed by at least one processor, configure the at least one processor to select, from a set of code rates, a code rate to be used to encode a stream of bits using a polar code, based on at least one of a downlink control channel aggregation size, an uplink control channel assignment, or a payload size of the stream of bits, encode the stream of bits using the polar code and the selected code rate, and transmit the encoded stream of bits.

Certain aspects of the present disclosure provide a method for wireless communications in a network. The method generally includes receiving a stream of encoded bits encoded using a polar code, based on at least one of a downlink control channel aggregation size, an uplink control channel assignment, or a payload size of the stream of bits, selecting, from a set of code rates, a code rate to be used to decode the stream of encoded bits, and decoding the stream of encoded bits using selected code rate.

Certain aspects of the present disclosure provide an apparatus for wireless communications in a network. The apparatus generally includes at least one processor configured to receive a stream of encoded bits encoded using a polar code, based on at least one of a downlink control channel aggregation size, an uplink control channel assignment, or a payload size of the stream of bits, select, from a set of code rates, a code rate to be used to decode the stream of encoded bits, and decode the stream of encoded bits using selected code rate. The apparatus also generally includes a memory coupled with the at least one processor.

Certain aspects of the present disclosure provide an apparatus for wireless communications in a network. The apparatus generally includes means for receiving a stream of encoded bits encoded using a polar code, based on at least one of a downlink control channel aggregation size, an uplink control channel assignment, or a payload size of the stream of bits, means for selecting, from a set of code rates, a code rate to be used to decode the stream of encoded bits, and means for decoding the stream of encoded bits using selected code rate.

Certain aspects of the present disclosure provide a non-transitory computer-readable medium for wireless communications in a network. The non-transitory computer-readable medium generally includes instructions that, when executed by at least one processor, configure the at least one processor to receive a stream of encoded bits encoded using a polar code, based on at least one of a downlink control channel aggregation size, an uplink control channel assignment, or a payload size of the stream of bits, select, from a set of code rates, a code rate to be used to decode the stream of encoded bits, and decode the stream of encoded bits using selected code rate.

Numerous other aspects are provided including methods, apparatus, systems, computer program products, and processing systems.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
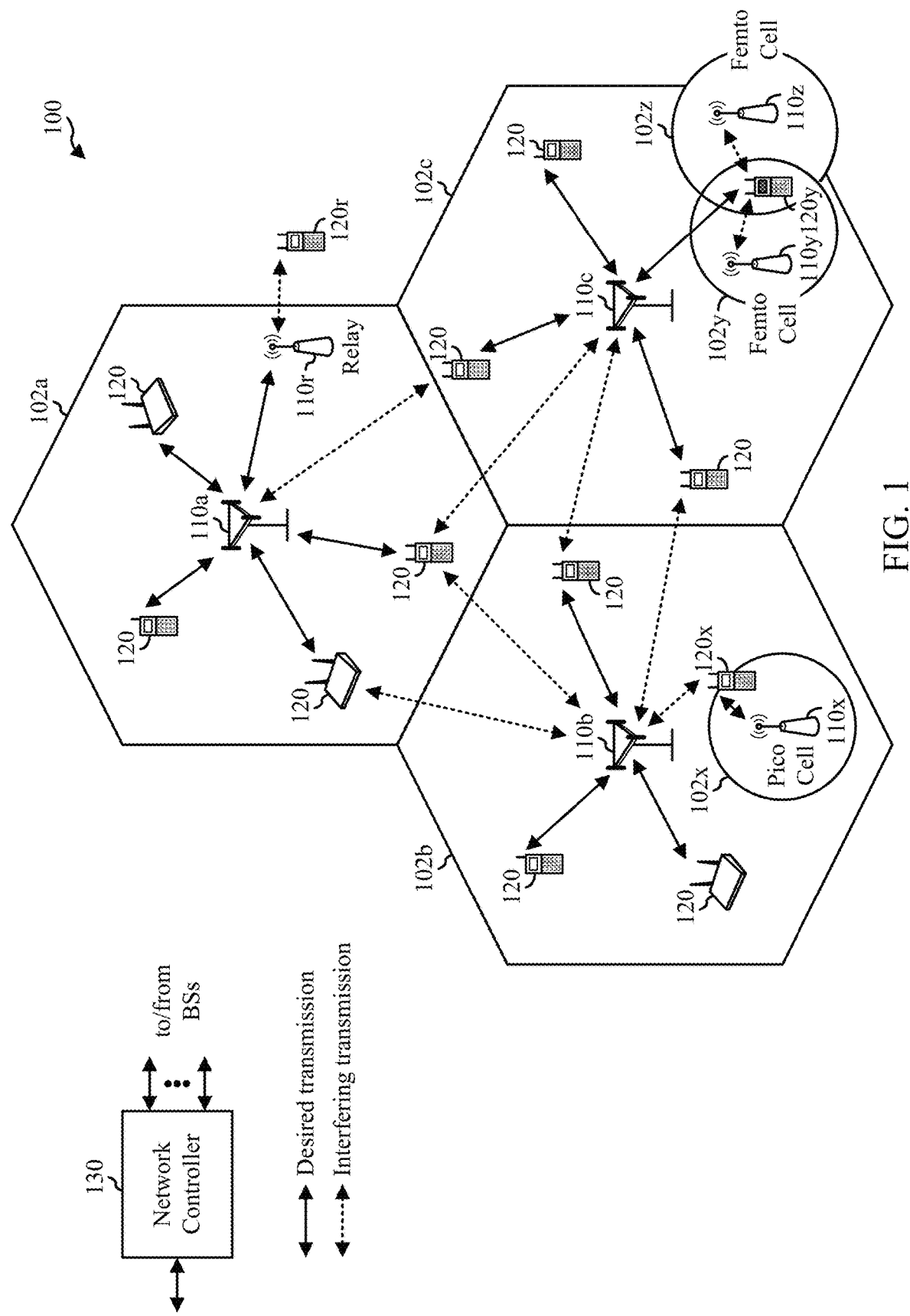
FIG. 1 is a block diagram conceptually illustrating an example telecommunications system, in accordance with certain aspects of the present disclosure.

Aspects of the present disclosure provide apparatus, methods, processing systems, and computer readable mediums for multi-slice networks, such as new radio (NR) (new radio access technology or 5G technology).

5G may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra reliable low latency communications (URLLC). These services may include latency and reliability requirements. These services may also have different transmission time intervals (TTI) to meet respective quality of service (QoS) requirements. In addition, these services may co-exist in the same subframe.

In 5G, Polar codes may be used to encode information transmitted on DL control channels. However, using a single baseline code rate for Polar codes (e.g similar to 1/3 TBCC used in LTE) may not be sufficient to handle all possible payload and aggregation level combinations when transmitting the encoded information. Thus, aspects of the present disclosure present techniques for selecting, from a set of baseline code rates, a code rate for encoding information using a polar code.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA), time division synchronous CDMA (TD-SCDMA), and other variants of CDMA. cdma2000 covers IS-2000, IS-95 and IS-856 standards. A TDMA network may implement a radio technology such as global system for mobile communications (GSM). An OFDMA network may implement a radio technology such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies, such as a 5G nextgen/NR network.

Example Wireless Communications System

FIG. 1 illustrates an example wireless network 100, such as a new radio (NR) or 5G network, in which aspects of the present disclosure may be performed, for example, for control channel rate code selection.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, gNB, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed, employing a multi-slice network architecture.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc.

Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

NR may utilize OFDM with a CP on the uplink and downlink and include support for half-duplex operation using TDD. A single component carrier bandwidth of 100 MHz may be supported. NR resource blocks may span 12 sub-carriers with a subcarrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or one or more DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and one or more DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
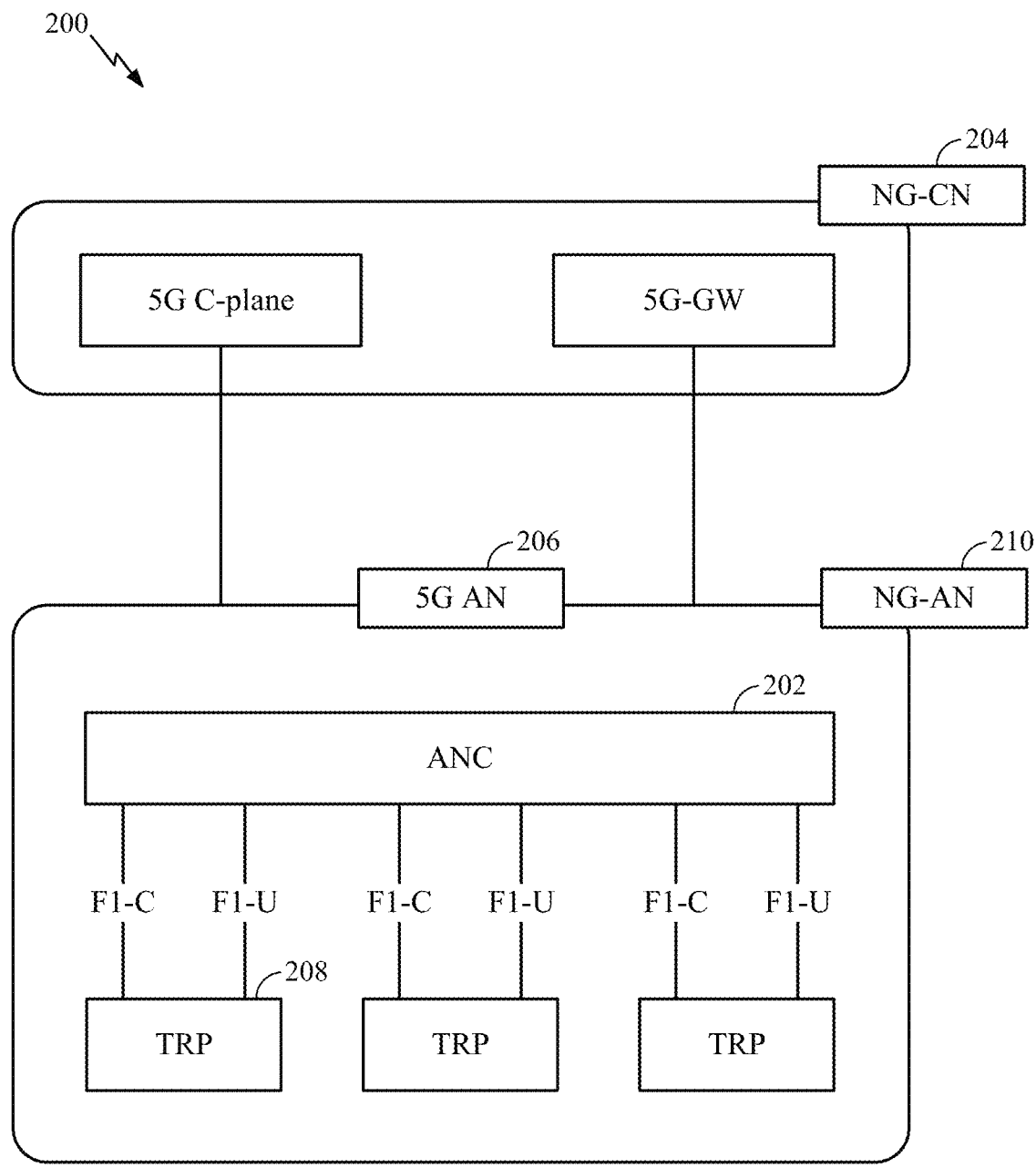
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, gNB, or some other term). As described above, a TRP may be used interchangeably with "cell" and may refer to a region where a same set of radio resources are available throughout the region.

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The logical architecture of a distributed RAN 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
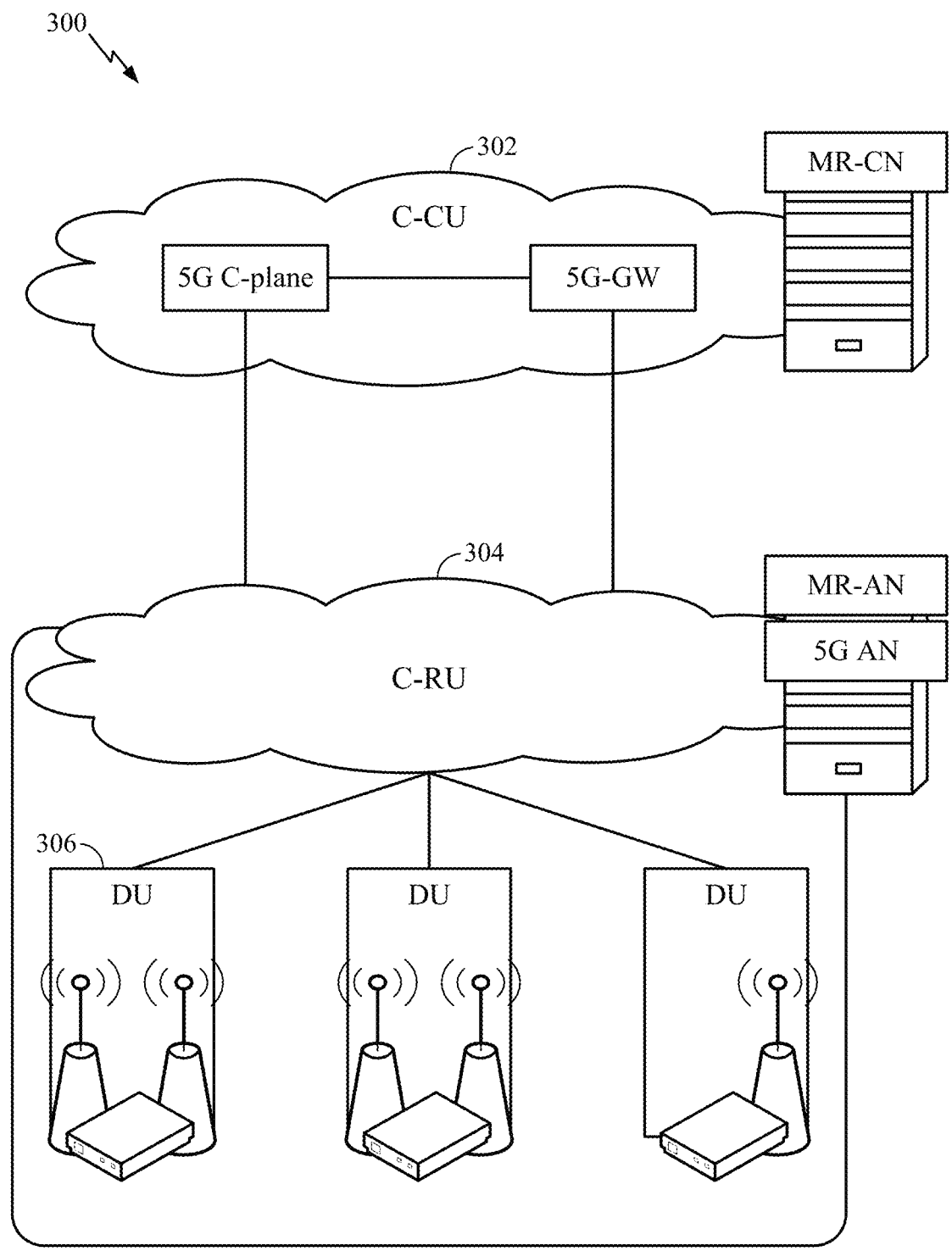
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
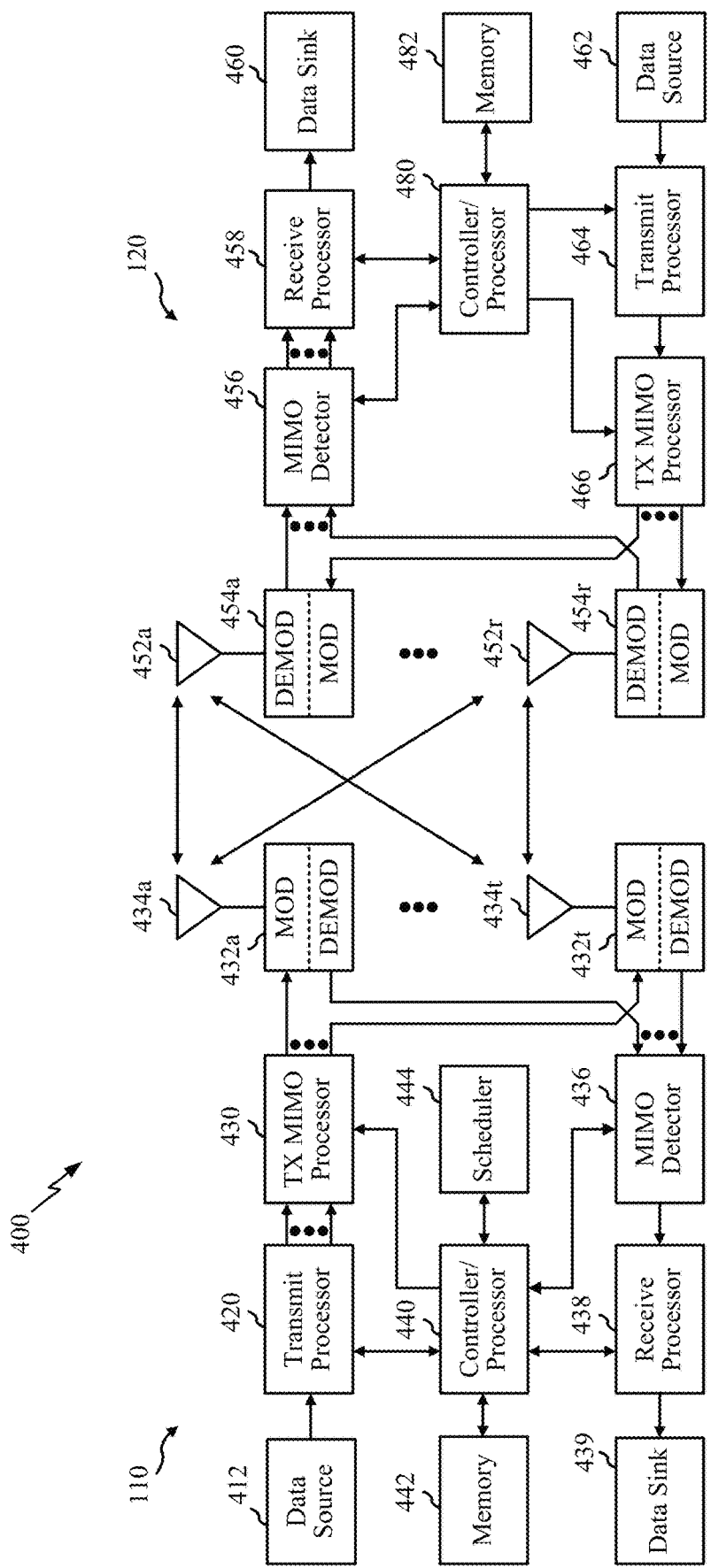
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIGS. 8A-8B.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 12, and/or other processes for the techniques described herein. The processor 480 and/or other processors and modules at the UE 120 may also perform or direct, e.g., the execution of the functional blocks illustrated in FIGS. 8 and/or 11, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
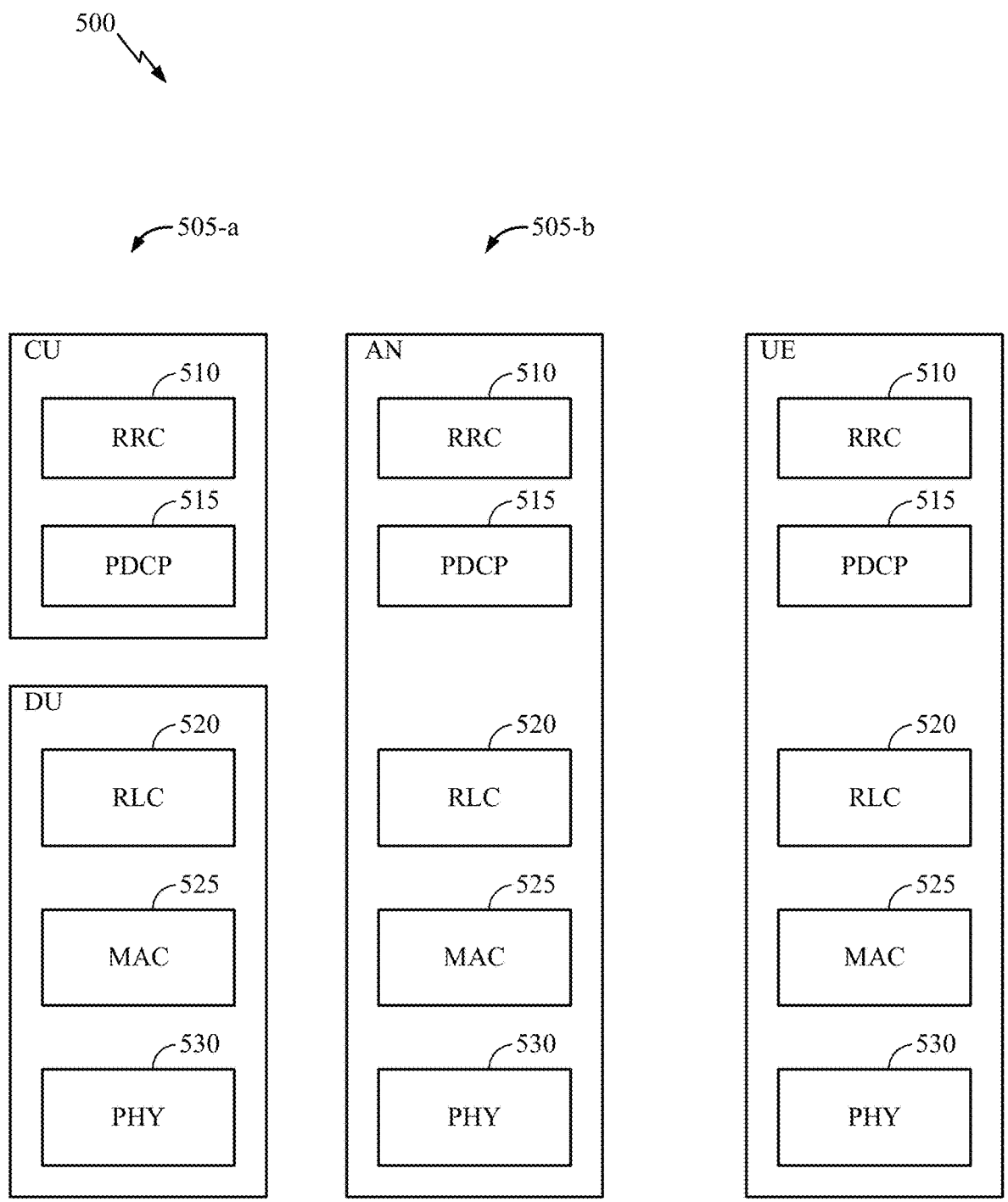
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or one or more DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
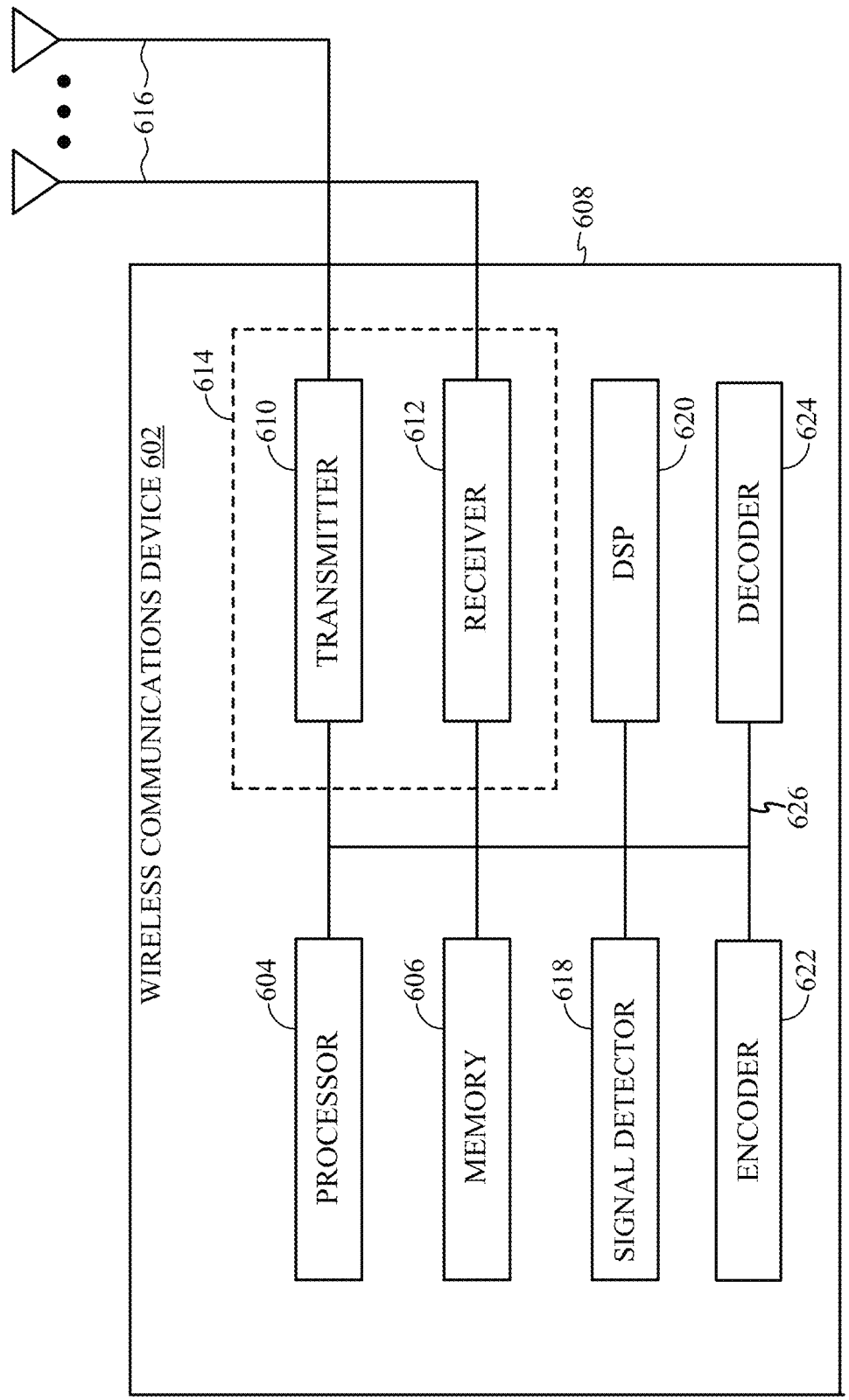
FIG. 6 illustrates a block diagram of an example wireless device in accordance with certain aspects of the present disclosure.

FIG. 6 illustrates various components that may be utilized in a wireless communications device 602 that may be employed within the wireless communication system from FIG. 1. The wireless communications device 602 is an example of a device that may be configured to implement the various methods described herein. The wireless communications device 602 may be an BS 110 from FIG. 1 or any of user equipments 120.

The wireless communications device 602 may include a processor 604 which controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless communications device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. The encoder may select a rate code to encode the signals and may store the encoded signals in a circular buffer (not shown). The encoder may also perform rate matching on the encoded signals, as described below. Further, the wireless communications device 602 may include a decoder 624 for use in decoding received signals, for example, by selecting a rate code to decode the received signals.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
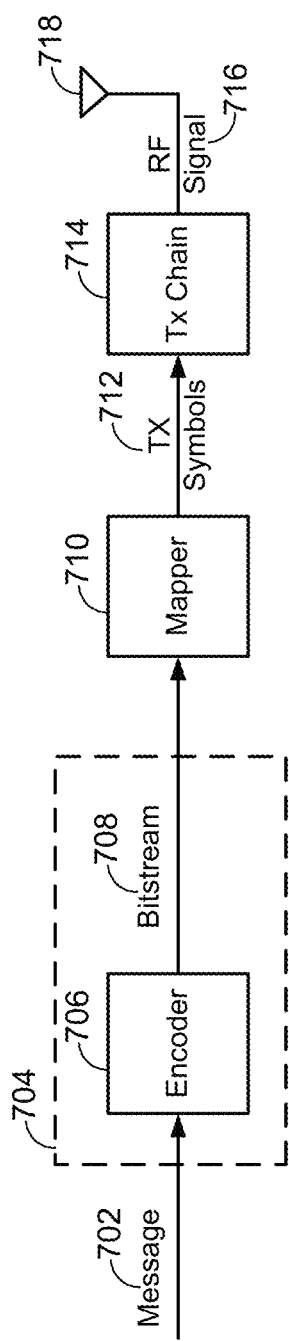
FIG. 7 is a simplified block diagram illustrating a decoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using polar codes described below). In one example, an encoder 706 in a base station (e.g., BS 110) (or a UE 120 on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the B S 110 or another network entity. In some cases, the encoder 706 may select, from a set of rate codes, a rate code to be used to encode the message. The encoded bitstream 708 may then be stored in circular buffer and rate-matching may be performed on the stored encoded bitstream, for example, according to aspects presented below. After the encoded bitstream 708 is rate-matched, the encoded bitstream 708 may then be provided to a mapper 710 that generates a sequence of Tx symbols 712 that are modulated, amplified and otherwise processed by Tx chain 714 to produce an RF signal 716 for transmission through antenna 718.

Figure 8:
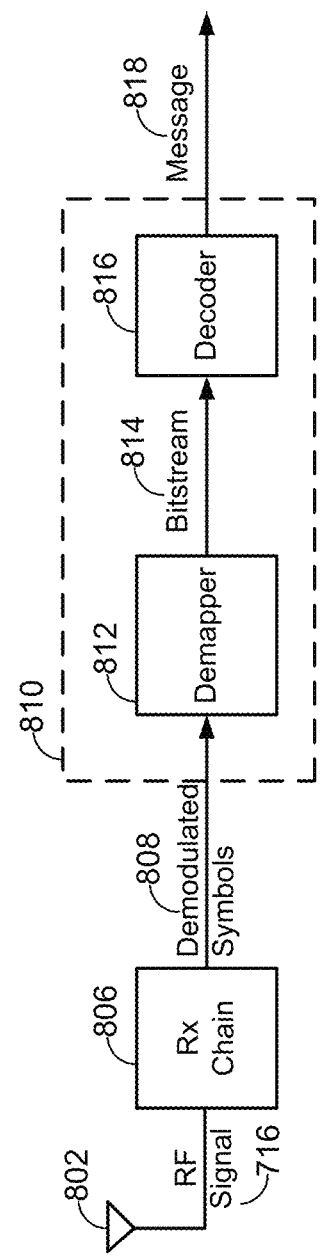
FIG. 8 is a simplified block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode a wirelessly transmitted signal including an encoded message (e.g., a message encoded using techniques presented herein). In various examples, the modem 810 receiving the signal may reside at the access terminal, at the base station, or at any other suitable apparatus or means for carrying out the described functions. An antenna 802 provides an RF signal 716 (i.e., the RF signal produced in FIG. 4) to an access terminal (e.g., UE 120). An Rx chain 806 processes and demodulates the RF signal 716 and may provide a sequence of symbols 808 to a demapper 812, which produces a sequence of a-priori probabilities (e.g., in bitstream 814), often represented as log-likelihood ratios (LLRs) corresponding to the encoded message.

A decoder 816 may then be used to decode m-bit information strings from a bitstream that has been encoded using a coding scheme (e.g., as described herein). The decoder 816 may comprise a polar decoder, an LDPC decoder, a Viterbi decoder, an algebraic decoder, a butterfly decoder, or another suitable decoder. In one example, a Polar decoder employs the successive cancellation (SC) or successive cancellation list (SCL) decoding algorithm. An SC decoding algorithm essentially operates by performing a recursive depth-first traversal of a decoding tree, to convert the sequence of LLRs (e.g., in bitstream 814) into a bit sequence/message 818 corresponding to the message 702 (e.g., when the decoding is successful).

More specifically, assuming each codeword is of length N, where N must be an integer power of 2 so that $N=2^n$, and that the encoder 706 encodes K information bits into N encoded bits, and rate-matches these to M bits (e.g., as described below), the LLRs from 814 corresponding to each codeword are first de-ratematched from M bits to N bits by the decoder 816, and a binary tree of depth $n=\log 2(N)$ (e.g., referred to as the decoding tree) is constructed. The root of the tree corresponds to the received vector of N log likelihood ratios (LLRs) to be decoded, and the leaves of the tree correspond to each of the decoded bits, so that N-K of the leaves correspond to the N-K frozen bits (which should decode to the frozen value (zero)), while the remaining K leaves correspond to the K information bits. Let the degree, d, of a node refer to its height above the leaves in the decoding tree, where leaves have d=0 and the root of the tree has $d=\log 2(N)$.

In SC decoding, converting the $2^d$ LLRs corresponding to any node v into the $2^d$ decoded bits corresponding to the $2^d$ leaves of that node (e.g., referred to as decoding node v) is performed via a recursive depth-first traversal of the decoding tree, as follows. For example, the decoder 816 may first use the $2^d$ LLRs corresponding to this node v to calculate the $2^{d-1}$ LLRs corresponding to node v's left child. The decoder 816 may then decode the subcode corresponding to node v's left child. The decoder 816 may then re-encode the length $2^{d-1}$ codeword corresponding to the left child. This partial codeword is referred to as a (left) partial sum. The decoder 816 may then use the partial sum from node v's left child along with the $2^d$ LLRs corresponding to node v to calculate the $2^{d-1}$ LLRs corresponding to v's right child. Thereafter, the decoder 816 may decode the subcode corresponding to node v's right child. Additionally, the decoder 816 may re-encode the length $2^d$ codeword corresponding to the right child and this partial codeword is referred to as a (right) partial sum. Thereafter, the decoder 816 may combine the left and right partial sums to get the partial sum (codeword) corresponding to v.

The above decoding algorithm may be performed recursively starting from the N LLRs at the tree's root node, having degree $d=\log 2(N)$. Applying hard decisions to each (single) LLR at each of the N leaf nodes, after removing the N-K frozen bits, results in the K information bits of the message 818 corresponding to the message 702 (e.g., when the decoding is successful). In some cases, the above decoding algorithm may include combining LLRs associated with lower aggregation levels with LLRs associated with higher aggregation levels and use the combined LLRs to decode the bitstream 814, for example, as described in greater detail below.

Figure 9:
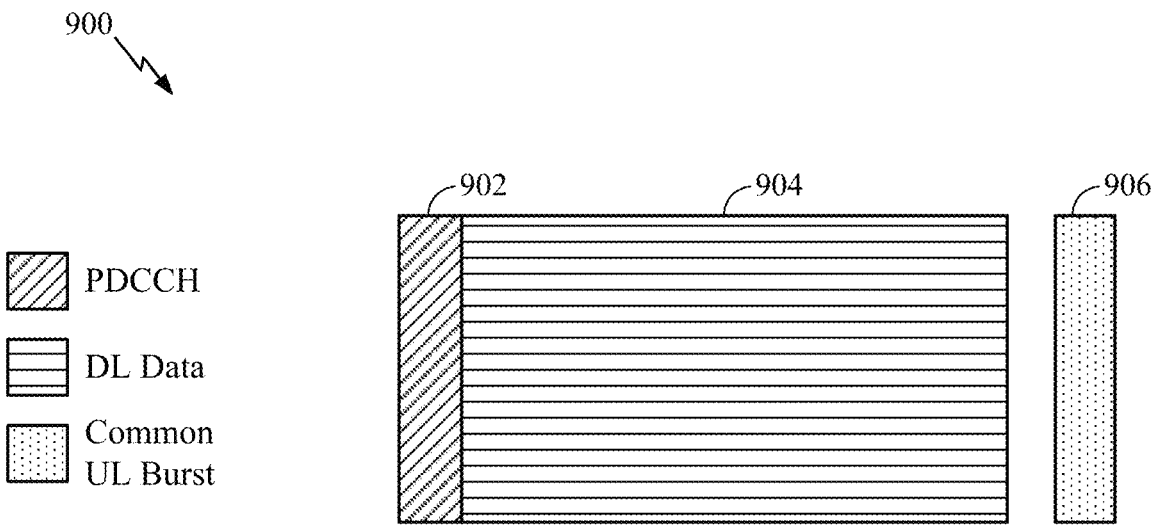
FIG. 9 illustrates an example of a DL-centric subframe, in accordance with certain aspects of the present disclosure.

FIG. 9 is a diagram 900 showing an example of a DL-centric subframe, which may be used by one or more devices (e.g., BS 110 and/or UE 120) to communicate in the wireless network 100. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PDSCH).

The DL-centric subframe may also include a common UL portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH) procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 10:
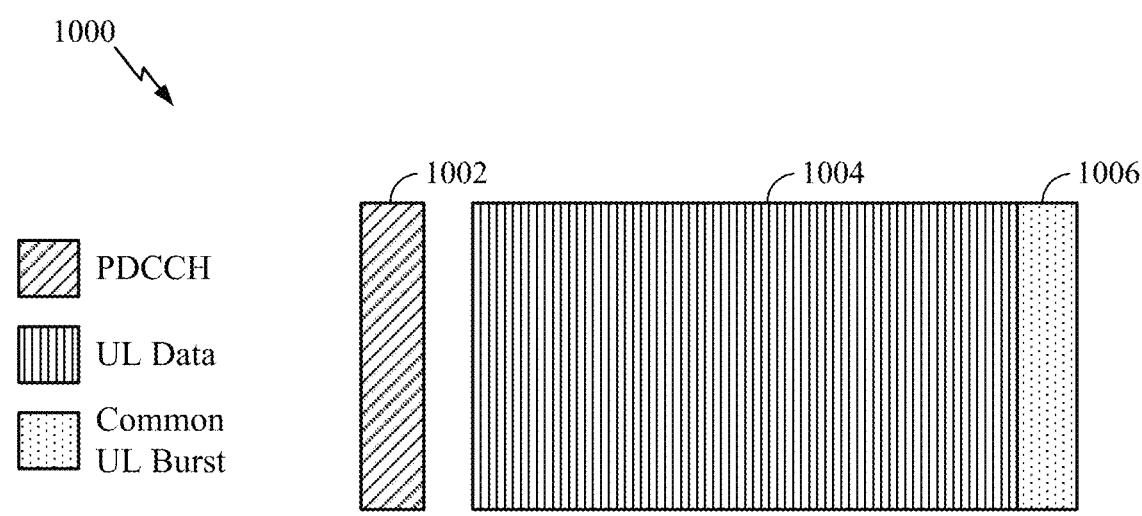
FIG. 10 illustrates an example of an UL-centric subframe, in accordance with certain aspects of the present disclosure.

FIG. 10 is a diagram 1000 showing an example of an UL-centric subframe, which may be used by one or more devices (e.g., BS 110 and/or UE 120) to communicate in the wireless network 100. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 1006 described above with reference to FIG. 10. The common UL portion 1006 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

Polar codes are a relatively recent breakthrough in coding theory which have been proven to asymptotically (for code size N approaching infinity) achieve the Shannon capacity. Polar codes have many desirable properties such as deterministic construction (e.g., based on a fast Hadamard transform), very low and predictable error floors, and simple successive-cancellation (SC) based decoding. They are currently being considered as a candidate for error-correction in next-generation wireless systems, and will be used for control channel encoding in 5G.

Polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

According to certain aspects, a codeword may be generated (e.g., by encoder 706) by using the generator matrix to encode a number of input bits consisting of K information bits and N-K "frozen" bits which contain no information and are "frozen" to a known value, such as zero. For example, given a number of input bits u=($u_0, u_1, \ldots, u_{N-1}$), a resulting codeword vector x=($x_0, x_1, \ldots, x_{N-1}$) may be generated by encoding the input bits using the generator matrix G. This resulting codeword may then be rate matched and transmitted by a base station over a wireless medium and received by a UE.

When the received vectors are decoded, for example by using a Successive Cancellation (SC) decoder (e.g., decoder 816), every estimated bit, $\hat{u}_i$, has a predetermined error probability given that bits $u_0^{i-1}$ were correctly decoded, that, for extremely large codesize N, tends towards either 0 or 0.5. Moreover, the proportion of estimated bits with a low error probability tends towards the capacity of the underlying channel. Polar codes exploit this phenomenon, called channel polarization, by using the most reliable K bits to transmit information, while setting to a predetermined value (such as 0), also referred to as freezing, the remaining (N–K) bits, for example as explained below.

Polar codes transform the channel into N parallel "virtual" channels for the N information and frozen bits. If C is the capacity of the channel, then, for sufficiently large values of N, there are almost NC channels which are extremely reliable and there are almost N(1–C) channels which are extremely unreliable. The basic polar coding scheme then involves freezing (i.e., setting to a known value, such as zero) the input bits in u corresponding to the unreliable channels, while placing information bits only in the bits of u corresponding to reliable channels. For short-to-medium N, this polarization may not be complete in the sense there could be several channels which are neither completely unreliable nor completely reliable (i.e., channels that are marginally reliable). Depending on the rate of transmission, bits corresponding to these marginally reliable channels may be either frozen or used for information bits.

Example Rate-Matching Scheme for Control Channel Using Polar Codes

In LTE, tail-biting convolutional codes (TBCCs) of code rate 1/3 are used as a baseline code for the encoding information sent on downlink (DL) control channels. In some cases, different downlink control information (DCI) payloads and aggregation levels require different code rates, which may be realized by rate matching from the baseline code, through either puncturing or repeating coded bits. That is, after encoding information using a 1/3 TBCC, the encoded information's code rate may be adjusted using rate matching (e.g., puncturing and/or repetition) before transmission.

In 5G as described above, Polar codes may be used to encode information transmitted on DL control channels. However, using a single baseline code rate baseline for Polar codes (e.g similar to 1/3 TBCC) may not be sufficient to handle all possible payload and aggregation level combinations when transmitting Polar-encoded information. Thus, aspects of the present disclosure present techniques for selecting, from a set of baseline code rates, a code rate for encoding information using a polar code. In some cases, selecting a code rate may be based on a control channel aggregation level and/or a payload size of a stream of bits to be encoded using a Polar code.

Figure 11:
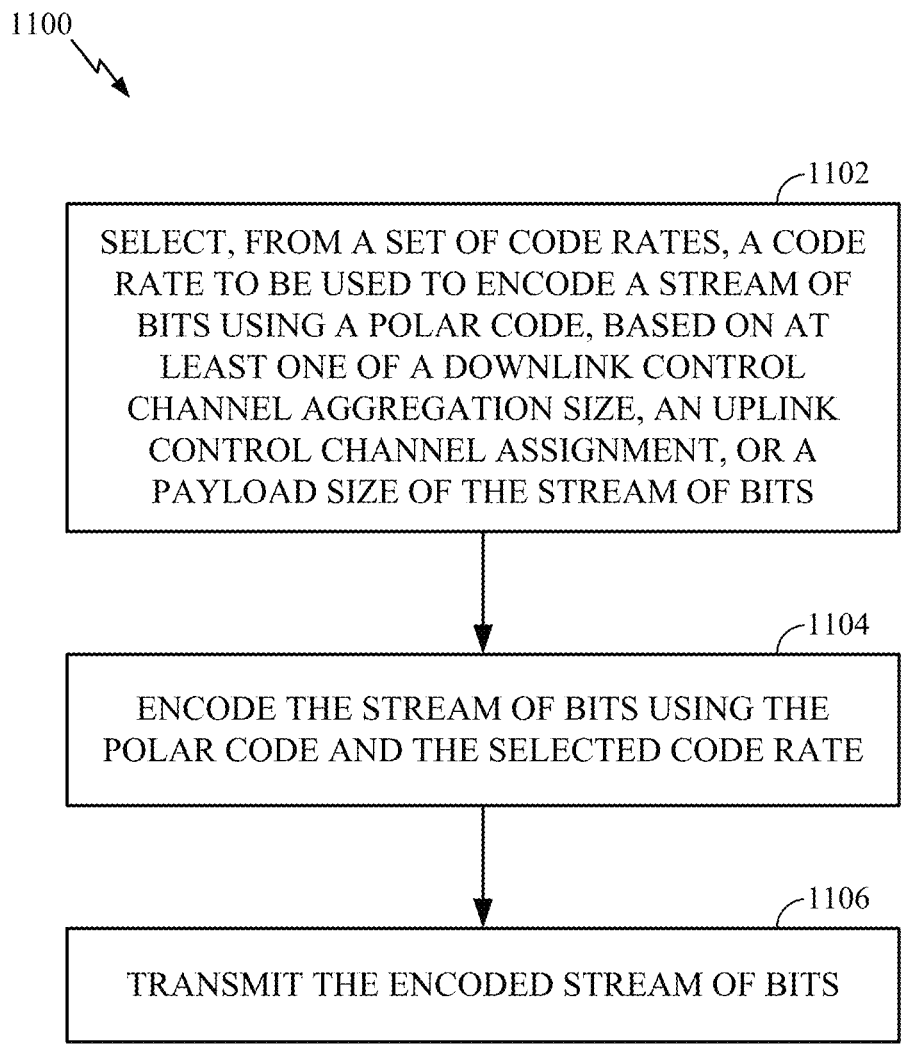
FIG. 11 is a flow diagram illustrating example operations for wireless communications in a network, in accordance with certain aspects of the present disclosure.

FIG. 11 illustrates example operations 1100 for wireless communications. Operations 1100 may be performed by a wireless communications device, such as a base station (BS 110), user equipment 120, and/or wireless communications device 602.

The wireless communications device may include one or more components as illustrated in FIGS. 4 and/or 6 which may be configured to perform the operations described herein. For example, the antenna 434, modulator/demodulator 432, transmit processor 420, controller/processor 440, and/or memory 442 of the base station 110, as illustrated in FIG. 4, may perform the operations described herein. Additionally or alternatively, the antenna 452, demodulator/modulator 454, transmit processor 464, controller/processor 480, and/or memory 482 of the user equipment 120, as illustrated in FIG. 4, may perform the operations described herein. Additionally or alternatively, one or more of the processor 604, memory 606, transceiver 614, DSP 320, encoder 622, decoder 620, and/or antenna(s) 616 as illustrated in FIG. 6 may be configured to perform the operations described herein.

Operations 1100 begin at 1102 by selecting, from a set of code rates, a code rate to be used to encode a stream of bits using a polar code, based on at least one of a downlink control channel aggregation level, an uplink control channel assignment size, or a payload size of the stream of bits. At 1104, the wireless communications device encodes the stream of bits using the polar code and the selected code rate. At 1106, the wireless communications device transmits the encoded stream of bits, for example, using one or antennas.

Figure 12:
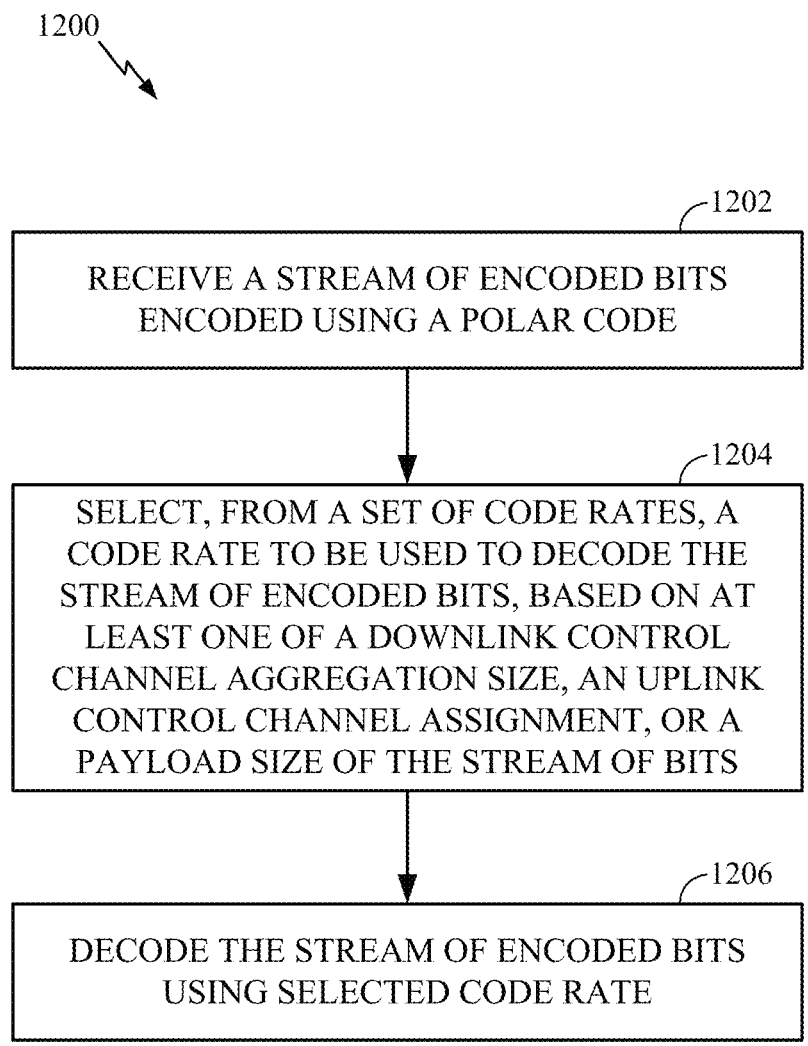
FIG. 12 is a flow diagram illustrating example operations for wireless communications in a network, in accordance with certain aspects of the present disclosure.

FIG. 12 illustrates example operations 1200 for wireless communications. Operations 1200 may be performed by a wireless communications device, such as a base station (BS 110), user equipment 120, and/or wireless communications device 602.

The wireless communications device may include one or more components as illustrated in FIGS. 4 and/or 6 which may be configured to perform the operations described herein. For example, the antenna 434, modulator/demodulator 432, transmit processor 420, controller/processor 440, and/or memory 442 of the base station 110, as illustrated in FIG. 4, may perform the operations described herein. Additionally or alternatively, the antenna 452, demodulator/modulator 454, transmit processor 464, controller/processor 480, and/or memory 482 of the user equipment 120, as illustrated in FIG. 4, may perform the operations described herein. Additionally or alternatively, one or more of the processor 604, memory 606, transceiver 614, DSP 320, encoder 622, decoder 620, and/or antenna(s) 616 as illustrated in FIG. 6 may be configured to perform the operations described herein.

Operations 1200 begin at 1202 by receiving a stream of encoded bits encoded using a polar code. At 1204, the wireless communications device selects, from a set of code rates, a code rate to be used to decode the stream of encoded bits, based on at least one of a downlink control channel aggregation level, an uplink control channel assignment size, or a payload size of the stream of bits. At 1206, the wireless communications device, decodes the stream of encoded bits using selected code rate.

As noted, aspects of the present disclosure propose techniques for selecting, from a set of baseline code rates, a code rate for encoding information using a polar code. For example, a wireless communications device may select between X baseline Polar code rates to be used to encode a stream of bits for transmission on a control channel (e.g., a physical downlink control channel (PDCCH), a physical uplink control channel (PUCCH), etc.), where X>1. According to aspects, to reduce user equipment (UE) decoding complexity, X should not be very large.

According to aspects, for a downlink control channel (e.g., PDCCH), the wireless communications device may select the code rate based on at least one of a payload size of the stream of bits to be transmitted on the downlink control channel or an aggregation level of the downlink control channel (e.g., the number of control channel elements used for sending control information). For example, a control message may be transmitted at aggregation level, L, if L CCEs are used to convey the message. For example, assuming an aggregation level of 4 or 8 with a payload size greater than 50 bits, the wireless communications device may use a first polar code rate (PC1), whereas a second polar code rate (PC2) may be used for an aggregation level of 1 or 2 with a payload size less than 50 bits. According to aspects, selecting the code rate in this manner (i.e., based on the aggregation level and/or payload size) allows for more efficient use of resources (e.g., bandwidth resources) and communication because it control the balance between coding gain and coding/decoding complexity.

In some cases, for an uplink control channel (e.g., PUCCH), the wireless communications device may select the code rate based on at least one of an assignment size of the uplink control channel (e.g., as indicated in downlink control channel information carrying an uplink grant) or a payload size of the stream of bits to be transmitted on the uplink control channel. In some cases, the assignment size of the uplink control channel may be defined as a number of resource elements and/or a number of resource blocks assigned to the uplink control channel. Further, in 5G, uplink control channels (e.g., PUCCH) have different durations. According to aspects, a longer duration means more REs for the uplink control channel, which may be treated as a larger uplink control channel assignment. Thus, the selection of a code rate for an uplink control channel may also be based on the duration of the uplink control channel. Additionally, in some cases, the wireless communications device (e.g., a UE) may receive an indication from a base station (e.g., in downlink control information carried on the PDCCH) of the code rate to be used for the uplink control channel (e.g., PUCCH). This indication may be separate from an uplink control channel assignment indication.

According to aspects, after encoding a stream of bits, the wireless communications device may store the encoded stream of bits in a circular buffer and perform rate-matching on the stored encoded bits. Rate matching is a process whereby the number of bits to be transmitted is matched to the available bandwidth of the number of bits allowed to be transmitted. In certain instances the amount of data to be transmitted is less than the available bandwidth, in which case all the data to be transmitted (and one or more copies of the data) will be transmitted—a technique called repetition. In other instances the amount of data to be transmitted exceeds the available bandwidth, in which case a certain portion of the data to be transmitted will be omitted from the transmission, for example, using techniques known as puncturing and shortening.

According to aspects, puncturing, shortening, or repetition of bits stored in the circular buffer may be performed according to a puncturing, shortening, or repetition pattern, respectively. According to aspects, this pattern may be a function of the selected rate code. In other words, based on the selected code rate, a pattern, indicating which bits in the circular buffer are to be punctured, shortened, and/or repeated, may be determined. For example, assuming that the wireless communication device has chosen a polar code rate, PC1, having rate 1/3 for a given Payload Size of 40 bits and aggregation level of 4 which requires a rate R>0.4, the wireless communications device may use a puncturing pattern specific to PC1 to rate match to rate R (i.e., 0.4).

According to aspects, in some cases, puncturing, shortening, and/or repetition may be performed by reading from the circular buffer the encoded steam of bits, and the puncture-pattern determined by interleaving performed on the encoded stream of bits prior to populating the circular buffer. In this case, the interleaver could be chosen as a function of the chosen Polar code rate.

According to aspects, after selecting a rate, the wireless communications device may encode the stream of bits using a native-sized polar code (e.g., N*=64, 128, 256, and 512) and the selected code rate (e.g., to generate a codeword). Thereafter, the wireless communications device may store the "native" encoded stream of bits (e.g., native-sized encoded stream of bits) in a circular buffer and perform rate-matching on the stored native encoded stream of bits, as described above.

According to aspects, Polar codes natively support codewords of size N* which may take a restricted set of values, e.g., N*=64, 128, 256, and 512 for both uplink and downlink transmission, with additional value of N*=1024 allowed for uplink transmissions. According to aspects, decoding complexity scales super-linearly as the size of the polar code/number of coded bits, N, increases. Further, for any fixed control information size, K, the coding gain obtained from extending to a lower native code-rate diminishes as N increases. For example, extending a native code rate from 1/3 to 1/6 may yield a noticeable gain compared with using the native rate 1/3 code with repetition to get rate 1/6, whereas extending a native rate from 1/6 to 1/12 may yield a small gain compared with using a native rate 1/6 code with repetition to get rate 1/12. Accordingly, when the allowed code rate is very low (e.g., below rate 1/6), it may not be desirable from a complexity point of view to use a very low native-rate code. Instead, a higher rate code may be selected by the wireless communication device and repetition performed to extend to lower rate with reduced complexity and similar performance.

In some cases, to support an arbitrary number (e.g., non-2n coded bits) of coded bits, N, rate matching is needed since native polar codes only support 2n coded bits. As noted above, rate matching may include puncturing, shortening, and repetition. For example, if (K=60,N=190) code is needed, the wireless communications device may either need to use repetition to extend to a native (60,128) Polar code or use shortening/puncturing on a native (60,256) Polar code. According to aspects, shortening/puncturing in this case may provide a better performance as it delivers more coding gain compared with repetition. However, the shortening/puncturing may incur higher encoding/decoding complexity compared with repetition.

According to aspects, in general when the target code rate (K/N) is already low (e.g., 1/6), then repetition may be preferred because the coding gain from puncturing/shortening may be small given that K/N (i.e., R) is already low. However, according to aspects, when the target code rate (K/N) is high, then puncturing/shortening may be preferred because of the larger coding gain despite the increase in complexity.

According to aspects, for a target code rate (K/N), the wireless communications device may need to determine the native Polar code that should be used (e.g., for performing rate-matching). For example, for a target code rate (K/N) the wireless communications device may need to determine the native Polar code, N*, from one of 64, 128, 256, or 512. In some cases, the determination of which native Polar code to use may be a function of at least one of the target code rate K/N or an absolute value of N. For example, if N is just above $2^n$ for some n, then using $N^*=2^n$ together with repetition may be better than using $N^*=2^{(n+1)}$ with puncturing or shortening. According to aspects, the determination of which native Polar code to use may based on a threshold, (β. For example, let (N+) denote the smallest 2n larger than N and (N−) as the largest 2n smaller than N. According to aspects, if N/(N−)<β, then repetition may be used from a (N−)-Polar code and if N/(N−)>β, then puncturing/shortening may be used from a (N+)-Polar code. In general, the selection of N* plays the trade-off between coding gain and coding complexity.

According to aspects, once the native code rate is determined, the wireless communications device may perform rate matching, as described above, on the native-sized encoded stream of bits. For example, when the number of coded bits, N, is greater than the native Polar code, N*, the wireless communications device may perform repetition on the native-sized encoded stream of bits, N*, to extend the coded bits to N. However, when the number of coded bits, N, is less than the native Polar code, N*, i.e., if N<N*, either puncturing or shortening will be performed on the native-sized encoded stream of bits. Additionally, in some cases, the wireless communications device may determine whether to perform repetition, puncturing, or shortening based on a threshold condition involving at least one of a size of the stream of bits, N, N+, or N− and/or their ratios (e.g., N/N+, NN−, etc.), as described above. For example, in some cases, the threshold condition may involve a comparison of N divided by N− to a threshold value or a comparison of N divided by N+ to the threshold value. For example, in some cases, when N/(N−) is less than the threshold, then repetition may be used from a Polar code with native size N*=N− and when N/(N−) is greater than the threshold, then puncturing/shortening may be used from a Polar code with native size N*=N+.

According to aspects, once the wireless communications device performs rate-matching on the stored encoded bits, the wireless communications device (e.g., a base station) may then may then transmit the (rate-matched) encoded stream of bits, which may be received by a second wireless communications device (e.g., a user equipment).

According to aspects, the second wireless communications device may receive the (an estimate) of the encoded stream of bits, determine/select a code rate to be used to decode the encoded stream of bits, and decode the encoded stream of bits using the selected code rate, for example, using techniques described above with reference to FIG. 8.

Additionally, the second wireless communications device may perform functions complementary to rate matching on the received (estimate) of the encoded stream of bits. For example, the second wireless communications device may perform de-rate-matching (e.g., de-repetition, de-puncturing, and/or de-shortening) on the encoded stream of bits using techniques similar to those described above with relation to rate-matching.

According to aspects, in some cases, due to the nested search-space structure in the downlink (DL) and uplink (UL) associated with decoding Polar codes, PDCCH/PUCCH resource elements (REs) for a higher aggregation level will contain those REs for a lower aggregation level. Thus, if decoding the PDCCH/PUCCH for a lower aggregation level hypothesis fails, the partial results (i.e., LLRs) from that decoding could be used to improve decoding of the PDCCH/PUCCH for the higher aggregation level. For example, when decoding a received stream of encoded bits, the partial results could provide improved LLRs for some or all of the REs at the lower aggregation level, to be supplemented with LLRs from the additional REs that together make up the higher aggregation level. In other words, when decoding a stream of received bits, the wireless communications device (e.g., a BS and/or UE) may determine LLRs associated with a lower aggregation level and combine those LLRs with LLRs associated with a higher aggregation level to improve decoding efficiency. According to aspects, decoding can proceed in increasing order of aggregation level hypothesis to allow exploiting these improved (i.e., combined) LLRs.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for selecting, means for performing (e.g., rate-matching), means for encoding, means for puncturing, means for repeating, means for generating, means for decoding, means for storing, and/or means for combining (e.g., LLRs) may comprise one or more processors or antennas at the BS 110 or UE 120, such as the transmit processor 220, controller/processor 240, receive processor 238, or antennas 234 at the BS 110 and/or the transmit processor 264, controller/processor 280, receive processor 258, or antennas 252 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user equipment 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of wireless communication, comprising
selecting a code rate to be used to encode information bits to form an encoded stream of bits of size N based on a payload size of the information bits;
detecting a ratio of N divided by $N^-$ is less than a threshold value, wherein $N^-$ equals a largest integer power of two that is less than or equal to N;
selecting a native polar code of size $N^*$ to be $N^-$ in response to detecting the ratio of N divided by $N^-$ is less than the threshold value;
encoding the information bits based on the native polar code of size $N^*$ and the selected code rate to form a native-sized encoded stream of bits of size $N^*$;
performing rate matching on the native-sized encoded stream of bits of size $N^*$ to form the encoded stream of bits of size N by:
performing repetition on the native-sized encoded stream of bits of size $N^*$; or
performing puncturing or shortening on the native-sized encoded stream of bits of size $N^*$; and
transmitting the encoded stream of bits of size N.

2. The method of claim 1, further comprising receiving, from a base station, an indication of the code rate to use to form the encoded stream of bits of size N, wherein the encoded stream of bits of size N is transmitted on a physical uplink control channel (PUCCH).

3. The method of claim 1, further comprising:
storing the native-sized encoded stream of bits of size $N^*$ in a circular buffer.

4. The method of claim 3, wherein performing rate-matching on the stored native-sized encoded stream of bits of size $N^*$ comprises puncturing a first set of bits of the stored native-sized encoded stream of bits according to a puncturing pattern.

5. The method of claim 4, wherein the puncturing pattern is a function of at least one of the selected code rate, N, or $N^*$.

6. The method of claim 3, wherein performing rate-matching on the stored native-sized encoded stream of bits of size $N^*$ comprises repeating a second set of bits of the stored encoded native-sized stream of bits of size $N^*$ according to a repetition pattern, wherein the repetition pattern is a function of at least one of the selected code rate, N, or $N^*$.

7. The method of claim 3, wherein the code rate is selected according to a size of the information bits divided by N.

8. The method of claim 7, wherein performing rate-matching comprises:
performing repetition on the stored native-sized encoded stream of bits of size $N^*$ when N is greater than $N^*$; and
performing puncturing or shortening on the stored native-sized encoded stream of bits of size $N^*$ when N is less than $N^*$.

9. The method of claim 1, further comprising:
performing the repetition on the native-sized encoded stream of bits when $M/(N^-)$ is less than the threshold value; or
performing the puncturing or shortening on the native-sized encoded stream of bits when $M/(N^-)$ is greater than the threshold value.

10. The method of claim 1, further comprising determining the ratio of N divided by $N^-$ and comparing the ratio to the threshold value, wherein selecting $N^*$ is based on the determined ratio and the comparison of the ratio to the threshold value.

11. The method of claim 1, further comprising selecting $N^*$ to be $N^+$ when the ratio of N divided by $N^-$ is greater than the threshold value, wherein $N^+$ equals a smallest integer power of two that is larger than or equal to N.

12. The method of claim 1, wherein the threshold value is fixed and not dependent on $N^*$ or $N^-$.

13. A method of wireless communication, comprising
receiving an encoded stream of bits of size N encoded using a polar code;
selecting a code rate to be used to decode the encoded stream of bits of size N, based on a payload size of the encoded stream of bits of size N;
detecting a ratio of N divided by $N^-$ is less than a threshold value, wherein $N^-$ equals a largest integer power of two that is less than or equal to N;
selecting a native polar code of size $N^*$ to be $N^-$ in response to detecting the ratio of N divided by $N^-$ is less than the threshold value;
performing de-rate matching on the encoded stream of bits of size N to form a native-sized encoded stream of bits of size $N^*$; and
decoding the native-sized encoded stream of bits of size $N^*$ based on the selected code rate.

14. The method of claim 13, wherein:
the encoded stream of bits of size N is received on a control channel designed using nested aggregation levels; and
decoding the native-sized encoded stream of bits of size $N^*$ further comprises:
combining log-likelihood ratios associated with a lower aggregation level of the nested control channel with log-likelihood ratios associated with a higher aggregation level of the nested control channel; and
decoding the native-sized encoded stream of bits of size $N^*$ based further on the combined log-likelihood ratios.

15. The method of claim 14, wherein the nested control channel comprises a physical downlink control channel (PDCCH) or a physical uplink control channel (PUCCH).

16. The method of claim 13, further comprising:
storing the encoded stream of bits of size N in a circular buffer.

17. The method of claim 16, wherein performing the de-rate-matching on the stored encoded stream of bits of size N comprises determining the native Polar code of size $N^*$ based on at least one of a target code rate or an absolute value of N.

18. The method of claim 17, wherein performing the de-rate-matching comprises:
performing de-repetition on the stored encoded stream of bits of size N when N is greater than $N^*$; and
performing de-puncturing or de-shortening on the stored encoded stream of bits of size N when N is less than $N^*$.

19. The method of claim 13, wherein performing the de-rate matching comprises:
performing de-repetition on the stored encoded stream of bits of size N when $N/(N^-)$ is less than the threshold value; or
performing de-puncturing or de-shortening on the stored encoded stream of bits of size N when $N/(N^-)$ is greater than the threshold value.

20. An apparatus for wireless communication, comprising:

at least one processor configured to:
   select a code rate to be used to encode information bits to form an encoded stream of bits of size N based on a payload size of the information bits;
   detect a ratio of N divided by $N^-$ is less than a threshold value, wherein $N^-$ equals a largest integer power of two that is less than or equal to N;
   select a native polar code of size $N^*$ to be $N^-$ in response to detecting the ratio of N divided by $N-$ is less than the threshold value;
   encode the information bits based on the native polar code of size $N^*$ and the selected code rate to form a native-sized encoded stream of bits of size $N^*$;
   perform rate matching on the native-sized encoded stream of bits of size $N^*$ to form the encoded stream of bits of size N by:
      performing repetition on the native-sized encoded stream of bits of size $N^*$; or
      performing puncturing or shortening on the native-sized encoded stream of bits of size $N^*$; and
   transmit the encoded stream of bits of size N; and
a memory coupled with the at least one processor.

21. An apparatus for wireless communication, comprising:
at least one processor configured to:
   receive a stream of encoded bits of size N encoded using a polar code;
   select a code rate to be used to decode the stream of encoded bits of size N, based on a payload size of the stream of bits;
   detect a ratio of N divided by $N^-$ is less than a threshold value, wherein $N^-$ equals a largest integer power of two that is less than or equal to N;
   select a native polar code of size $N^*$ to be $N^-$ in response to detecting the ratio of N divided by $N^-$ is less than the threshold value;
   perform de-rate matching on the encoded stream of bits of size N to form a native-sized encoded stream of bits of size $N^*$; and
   decode the native-sized stream of encoded bits of size $N^*$ based on the selected code rate; and
a memory coupled with the at least one processor.

* * * * *